(12) United States Patent
Ikegawa et al.

(10) Patent No.: US 9,640,448 B2
(45) Date of Patent: May 2, 2017

(54) FILM FORMING METHOD, FILM FORMING APPARATUS, AND STORAGE MEDIUM

(71) Applicant: TOKYO ELECTRON LIMITED, Tokyo (JP)

(72) Inventors: Hiroaki Ikegawa, Nirasaki (JP); Hiromi Shima, Nirasaki (JP); Yusuke Tachino, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/080,916

(22) Filed: Mar. 25, 2016

(65) Prior Publication Data
US 2016/0284613 A1 Sep. 29, 2016

(30) Foreign Application Priority Data
Mar. 27, 2015 (JP) ................. 2015-067128

(51) Int. Cl.
| | | |
|---|---|---|
| *H01L 21/66* | (2006.01) | |
| *C23C 16/455* | (2006.01) | |
| *C23C 16/52* | (2006.01) | |
| *C23C 16/40* | (2006.01) | |
| *C23C 16/44* | (2006.01) | |
| *H01L 21/67* | (2006.01) | |
| *H01L 21/02* | (2006.01) | |

(52) U.S. Cl.
CPC ............ *H01L 22/20* (2013.01); *C23C 16/405* (2013.01); *C23C 16/4408* (2013.01); *C23C 16/45544* (2013.01); *C23C 16/52* (2013.01); *H01L 21/0228* (2013.01); *H01L 21/02189* (2013.01); *H01L 21/67253* (2013.01)

(58) Field of Classification Search
CPC ......... H01L 21/28194; H01L 21/28202; H01L 21/823857; H01L 29/518
See application file for complete search history.

(56) References Cited

U.S. PATENT DOCUMENTS

| | | | | |
|---|---|---|---|---|
| 5,241,851 A | * | 9/1993 | Tapp ................... | G01N 33/0026 73/29.01 |
| 2008/0233017 A1 | * | 9/2008 | Sato .................... | H01S 5/18358 422/129 |

(Continued)

FOREIGN PATENT DOCUMENTS

| | | |
|---|---|---|
| JP | 2001-332501 A | 11/2001 |
| JP | 2013-161988 A | 8/2013 |

*Primary Examiner* — Jaehwan Oh
(74) *Attorney, Agent, or Firm* — Nath, Goldberg & Meyer; Jerald L. Meyer

(57) ABSTRACT

A film forming apparatus, which forms a thin film formed of a metal oxide on a substrate by alternately supplying a raw material gas formed of an organic material containing a metal and an oxidation gas for oxidizing the organic material to the substrate a plurality of times, within a reaction vessel under a vacuum atmosphere, is provided. A control part outputs a control signal for comparing a moisture concentration detected by a moisture detection part with a set value after initiation of a step of supplying the oxidation gas and before starting a step of supplying the raw material gas, and when the moisture concentration exceeds a set value, for increasing a substitution operation of an atmosphere substitution step.

8 Claims, 8 Drawing Sheets

(56) References Cited

U.S. PATENT DOCUMENTS

| | | | |
|---|---|---|---|
| 2010/0143608 A1* | 6/2010 | Ruiz | C23C 16/06 427/576 |
| 2012/0192793 A1* | 8/2012 | Fukumori | C23C 16/4412 118/724 |
| 2015/0045961 A1* | 2/2015 | Koshti | H01L 21/67248 700/276 |
| 2015/0059350 A1* | 3/2015 | Kolvick | F02C 3/34 60/772 |
| 2015/0170939 A1* | 6/2015 | Rebstock | B08B 9/0321 137/15.04 |
| 2016/0147235 A1* | 5/2016 | Rice | H01L 21/67775 700/282 |
| 2016/0207147 A1* | 7/2016 | Van Hassel | B33Y 10/00 |

* cited by examiner

FILM FORMING METHOD, FILM FORMING APPARATUS, AND STORAGE MEDIUM

CROSS-REFERENCE TO RELATED APPLICATION

This application claims the benefit of Japanese Patent Application No. 2015-067128, filed on Mar. 27, 2015, in the Japan Patent Office, the disclosure of which is incorporated herein in its entirety by reference.

TECHNICAL FIELD

The present disclosure relates to a technique of forming a thin film formed of a metal oxide on a substrate by alternately supplying a raw material gas formed of an organic material containing a metal and an oxidation gas for oxidizing the organic material to the substrate a plurality of times.

BACKGROUND

It has been known that a metal oxide film is formed using a so-called atomic layer deposition (ALD) method on a semiconductor wafer (hereinafter, referred to as a "wafer") supported in the shape of a shelf on a wafer boat within a reaction vessel of a vertical heat treatment apparatus. For example, an ALD process of forming a zirconium oxide ($ZrO_2$) film by alternately supplying a raw material gas formed of a zirconium (Zr) compound and an ozone ($O_3$) gas as an oxidation gas has been proposed.

In this process, a step of supplying the raw material gas into the process vessel, a step of supplying the oxidation gas into the process vessel and a step of purging the interior of the process vessel between the step of supplying the raw material gas and the step of supplying the oxidation gas are set as an one-time film forming operation, and the film forming operation is repeated a plurality of times to form a $ZrO_2$ film having a predetermined thickness. In this manner, when the raw material gas and the oxidation gas are switched, the interior of the process vessel is substituted with the purge gas. When the substitution is insufficient, an amount of impurities may be increased in the $ZrO_2$ film or coverage performance may be degraded.

Therefore, it is necessary to optimize the substitution conditions, and this operation is performed for each process type, which is complicated. In addition, even though appropriate substitution conditions are set, a phenomenon that the film quality of the obtained $ZrO_2$ film is unintentionally degraded may occur during the course of repeatedly performing the film forming process within the process vessel.

In another related art, a method of recognizing an ending point of purge processing by measuring a moisture concentration of a gas discharged from a reaction chamber has been known as a purging method of an MOCVD apparatus. However, this method is intended to ensure that the purge processing is performed within a short time, while suppressing a waste of an alkyl metal used in the purge processing, but even the use of this technique cannot solve a technical problem of the present disclosure.

SUMMARY

Some embodiments of the present disclosure provide a technique capable of stably performing a desirable film forming process with less impurities within a film, in forming a thin film formed of a metal oxide on a substrate by alternately supplying a raw material gas formed of an organic material containing the metal and an oxidation gas for oxidizing the organic material to the substrate a plurality of times.

According to one embodiment of the present disclosure, a film forming apparatus which forms a thin film formed of a metal oxide on a substrate by alternately supplying a raw material gas formed of an organic material containing a metal and an oxidation gas for oxidizing the organic material to the substrate a plurality of times, within a reaction vessel under a vacuum atmosphere includes a vacuum-exhaust mechanism configured to exhaust an interior of the reaction vessel through an exhaust path, a moisture detection part configured to detect a moisture concentration in a gas flowing in the exhaust path, a substitution gas supply part configured to supply a substitution gas for substituting an internal atmosphere of the reaction vessel into the reaction vessel, and a control part configured to output a control signal for executing a step of supplying the raw material gas into the reaction vessel, a step of substituting the internal atmosphere of the reaction vessel with the substitution gas and then supplying the oxidation gas into the reaction vessel subsequent to the step of supplying the raw material gas, and an atmosphere substitution step including a step of supplying the substitution gas into the reaction vessel consecutively, and further output a control signal for comparing the moisture concentration detected by the moisture detection part with a set value after initiation of the step of supplying the oxidation gas and before starting the step of supplying the raw material gas, and when the moisture concentration exceeds the set value, for increasing a substitution operation of the atmosphere substitution step.

According to another embodiment of the present disclosure, a film forming method for forming a thin film formed of a metal oxide on a substrate by alternately supplying a raw material gas formed of an organic material containing a metal and an oxidation gas for oxidizing the organic material to the substrate a plurality of times, within a reaction vessel under a vacuum atmosphere includes supplying the raw material gas into the reaction vessel, substituting an internal atmosphere of the reaction vessel with a substitution gas and then supplying the oxidation gas to the reaction vessel subsequent to the supplying the raw material gas, an atmosphere substitution act including supplying the substitution gas into the reaction vessel consecutively, and detecting a moisture concentration within an exhaust path for vacuum-exhausting an interior of the reaction vessel after initiation of supplying the oxidation gas and before supplying the raw material gas, wherein the detected moisture concentration is compared with a set value and a substitution operation of the atmosphere substitution act is increased when the moisture concentration exceeds the set value.

According to still another embodiment of the present disclosure, there is provided a non-transitory computer-readable recording medium storing a computer program to be used in a film forming apparatus comprising a reaction vessel under a vacuum atmosphere, a vacuum exhaust mechanism, and a moisture detection part, wherein the computer program has a group of steps prepared to execute the aforementioned film forming method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
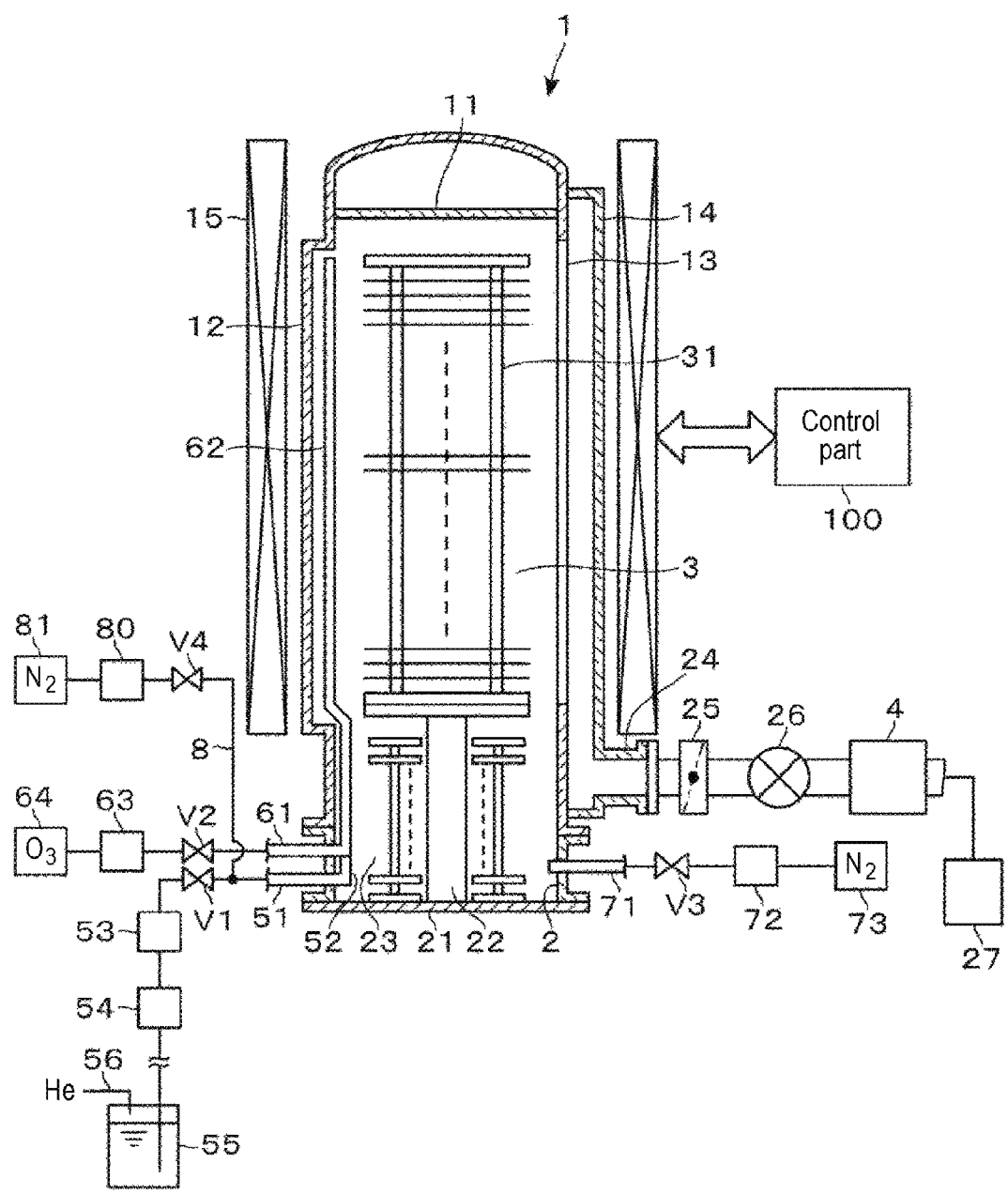
FIG. 1 is a longitudinal sectional view illustrating a film forming apparatus according to an embodiment of the present disclosure.
Figure 2:
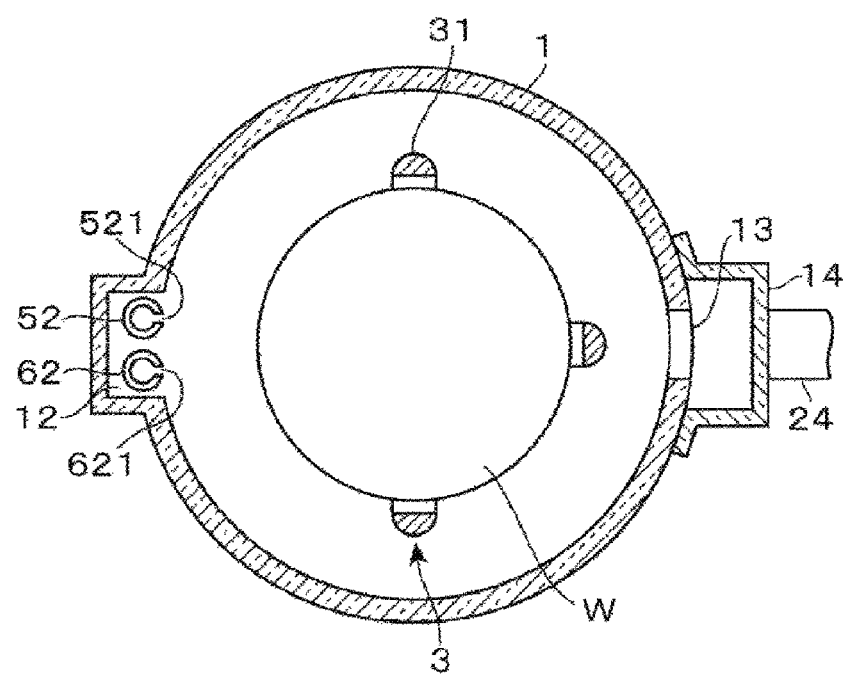
FIG. 2 is a cross-sectional view illustrating the film forming apparatus.

An example of a film forming apparatus for performing a film forming method of the present disclosure will be described with reference to FIGS. 1 and 2. FIG. 1 is a longitudinal sectional view of a film forming apparatus and FIG. 2 is a cross-sectional view of the film forming apparatus of FIG. 1. In FIGS. 1 and 2, reference numeral 1 denotes a reaction vessel formed of, for example, quartz, and having a vertically cylindrical shape, and an upper side of the reaction vessel 1 is sealed by a ceiling plate 11 formed of quartz. Further, a manifold 2 formed of, for example, stainless steel, and having a cylindrical shape is connected to a lower end of the reaction vessel 1. It is configured such that a lower end of the manifold 2 is opened as a substrate loading/unloading port and hermetically closed by a lid 21 formed of quartz and installed on a boat elevator (not shown). A rotary shaft 22 is installed to pass through a central portion of the lid 21, and a wafer boat 3, which is a substrate holding unit, is placed on an upper end thereof.

The wafer boat 3 includes, for example, three support pillars 31 to support outer edge portions of a wafer W so that a plurality of wafers W can be supported in the form of a shelf. The wafer boat 3 is configured to be moved up and down between a processing position at which the wafer boat 3 is loaded into the reaction vessel 1 so that the substrate loading/unloading port of the reaction vessel 1 is closed by the lid 21 and an unloading position of a lower side of the reaction vessel 1, and also configured to rotate around a vertical axis through the rotary shaft 22 by a rotation mechanism (not shown). In FIG. 1, reference numeral 23 is a heat insulating unit.

As illustrated in FIGS. 1 and 2, a portion of a sidewall of the reaction vessel 1 is configured as a space 12 surrounded by a wall portion swelling up outwardly along a longitudinal direction of the wafer boat 3. For example, the space 12 is formed to extend in a vertical direction so as to cover all the wafers W supported on the wafer boat 3. In addition, an exhaust port 13, which is vertically long and thin, is formed at a portion of the sidewall of the reaction vessel 1 in a circumferential direction, that is, in this example, at a region facing the space 12, in order to vacuum-exhaust an internal atmosphere of the reaction vessel 1. When a region in which the wafers W are arranged in the wafer boat 3 refers to as an arrangement region, the exhaust port 13 is formed along the arrangement direction of the wafers W so as to face the arrangement region. Thus, the exhaust port 13 is installed at the lateral sides of the entire wafers W.

An exhaust cover member 14 formed of, for example, quartz, and having a U-shape cross section is installed in the exhaust port 13 to cover it. For example, the exhaust cover member 14 is configured to vertically extend along a sidewall of the reaction vessel 1, and for example, one end of an exhaust path 24 is connected to a lower side of the exhaust cover member 14. The other end of the exhaust path 24 is connected to a vacuum pump 27 that forms a vacuum-exhaust mechanism through a pressure adjusting part 25 configured as, for example, a butterfly valve, and an opening/closing valve 26. In addition, as illustrated in FIG. 1, a cylindrical heater 15, which is a heating part, is installed to surround an outer periphery of the reaction vessel 1.

Further, the exhaust path 24 has a moisture detection part 4, for example, between the opening/closing valve 26 and the vacuum pump 27. The moisture detection part 4 detects a moisture concentration in a gas flowing in the exhaust path 24. As the moisture detection part 4, for example, an optical detection device including a light-transmissive cell through which an exhaust gas flows, a light emitting part configured to output a laser light to the light-transmissive cell, and a light receiving part configured to receive the laser light may be used. In this configuration, a laser light having a wavelength absorbed only to molecules of water is output from the light emitting part toward the cell, and received by the light receiving part. And then, a decrement of light, which is absorbed to the molecules of water, is obtained from the received amount of light and substituted with a molecular weight to detect moisture.

A raw material gas supply path 51 which supplies a raw material gas formed of an organic material containing a metal is inserted into a sidewall of the manifold 2, and a raw material gas nozzle 52 is installed at a front end of the raw material gas supply path 51. As the raw material gas, for example, an organic material containing zirconium (Zr) (hereinafter, referred to as a "Zr raw material"), for example, tetrakis(ethylmethylamino)zirconium (TEMAZ) gas is used. In addition, an oxidation gas supply path 61 which supplies an ozone ($O_3$) gas as an oxidation gas is inserted into the sidewall of the manifold 2, and an oxidation gas nozzle 62 is installed at a front end of the oxidation gas supply path 61. The oxidation gas is a gas for producing a metal oxide by oxidizing a raw material gas.

The raw material gas nozzle 52 and the oxidation gas nozzle 62 are formed of, for example, quartz pipes having a circular cross section, and are disposed to extend in the arrangement direction of the wafers W supported on the wafer boat 3 within the space 12 surrounded in the reaction vessel 1 as illustrated in FIG. 1. A plurality of gas discharge holes 521 and 621 (see FIG. 2) for discharging a raw material gas and an oxidation gas toward the wafers W are formed in the raw material gas nozzle 52 and the oxidation gas nozzle 62, respectively. The gas discharge holes 521 and 621 are formed to be spaced apart from one another at a predetermined distance in a longitudinal direction of the nozzles 52 and 62 to discharge a gas toward a gap between the wafers W adjacent to each other in a vertical direction and held in the wafer boat 3.

The raw material gas supply path 51 is connected to a reservoir 55, which stores a liquid Zr raw material (TEMAZ), through a valve V1, a vaporization part 53 and a flow rate adjusting part 54. A pressure feed pipe 56 is installed in the reservoir 55 and configured to supply a gas for pressure feeding, for example, a helium (He) gas or the like, to deliver the liquid Zr raw material to a downstream side of the reservoir 55. The flow rate adjusting part 54 is configured as, for example, a liquid mass flow controller, and the liquid Zr raw material with the flow rate adjusted is vaporized by the vaporization part 53. The obtained gas of the Zr raw material (Zr raw material gas) is supplied from the raw material gas nozzle 52 into the reaction vessel 1 at a predetermined timing. Further, a gas supply path 8, which is configured to supply an inert gas as a gas for substitution, for example, a nitrogen ($N_2$) gas, for example, from the downstream side of the valve V1, is connected to the raw material gas supply path 51, and the gas supply path 8 is connected to an $N_2$ gas supply source 81 through a valve V4 and a flow rate adjusting part 80.

The oxidation gas supply path 61 is connected to an $O_3$ gas supply source 64 through a valve V2 and a flow rate adjusting part 63. In addition, a substitution gas supply path 71, which is configured to supply an inert gas as a gas for substitution (hereinafter, referred to as a "substitution gas"), for example, a nitrogen ($N_2$) gas, is irruptively installed on the sidewall of the manifold 2. The substitution gas supply path 71 is connected to an $N_2$ gas supply source 73 through a valve V3 and a flow rate adjusting part 72, and in this example, a substitution gas supply part is configured with the substitution gas supply path 71 and the $N_2$ gas supply source 73. The valves are configured to adjust the supply of a gas and cutoff of gas supply, and the flow rate adjusting parts are configured to adjust a supply amount of gas. The $O_3$ gas (oxidation gas) and $N_2$ gas (substitution gas) are supplied in predetermined flow rates into the reaction vessel 1 from the oxidation gas nozzle 62 and the substitution gas supply path 71 at predetermined timings, respectively.

The film forming apparatus having the configuration described above is connected to a control part 100 as illustrated in FIG. 1. The control part 100 is configured as a computer including, for example, a central processing part (CPU) (not shown) and a memory part (not shown), and a program in which a group of steps (commands) regarding controlling when the operation of the film forming apparatus is performed, that is, in this example, when the film forming process is performed, on the wafers W within the reaction vessel 1 is prepared is recorded in the memory part. This program is stored in a storage medium such as, for example, a hard disk, a compact disk, a magnet optical disk, or a memory card, and installed in the computer therefrom.

For example, the program is configured to output a control signal for executing an atmosphere substitution step including a step of supplying a raw material gas into the reaction vessel 1, a step of substituting an internal atmosphere of the reaction vessel 1 with a substitution gas and subsequently supplying an oxidation gas into the reaction vessel 1, and a step of supplying a substitution gas into the reaction vessel 1. In addition, the program is configured to compare a moisture concentration detected by the moisture detection part 4 with a set value after the step of supplying an oxidation gas starts and before the step of supplying a raw material gas starts, and when the moisture concentration exceeds the set value, to output a control signal for increasing a substitution operation of the atmosphere substitution step as described later. In the film forming process, it is configured such that the raw material gas and the oxidation gas are alternately supplied into the reaction vessel 1 a plurality of times as described later, and the control part 100 measures the number of times of supplying the raw material gas and the oxidation gas individually to execute a series of film forming processes described later by a preset n number of times.

Figure 3:
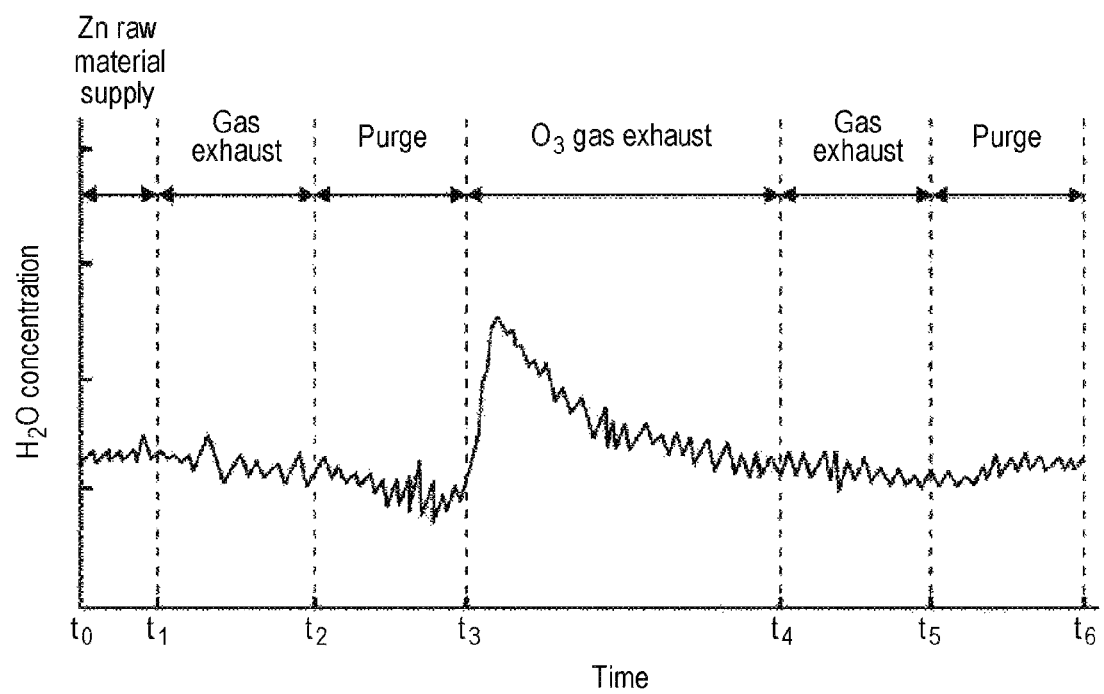
FIG. 3 is a characteristic diagram illustrating a change in moisture concentration over time in a general example of a film forming process.

Next, a film forming method performed in the film forming apparatus of the present disclosure will be described. First, a general method of the film forming process and moisture generated within the reaction vessel 1 during the film forming process will be described with reference to FIG. 3. FIG. 3 is a characteristic diagram illustrating a change in moisture concentration in a gas flowing in the exhaust path 24 detected by the moisture detection part 4 when the interior of the reaction vessel 1 is vacuum-exhausted while the film forming process is performed, over time. In the film forming process, first, the wafer boat 3 with the wafers W to be processed placed thereon is loaded into the reaction vessel 1, the interior of the reaction vessel 1 is set to a vacuum atmosphere of about 26.66 Pa by the vacuum pump 27, and a raw material gas supply step of supplying a raw material gas formed of an organic material containing Zr (hereinafter, referred to as a "Zr raw material gas") is executed.

Specifically, the wafers W are heated to a predetermined temperature, for example, 250 degrees C., by the heater 15, the wafer boat 3 is rotated, and in this state, the valve V1 is opened and the valves V2 and V3 are closed to supply the Zr raw material gas at a predetermined flow rate into the reaction vessel 1 through the raw material gas nozzle 52. Since the interior of the reaction vessel 1 has been set to a vacuum atmosphere, the Zr raw material gas discharged from the raw material gas nozzle 52 flows toward the exhaust port 13 within the reaction vessel 1 and is exhausted to the outside through the exhaust path 24. Since the wafer boat 3 is rotated, the Zr raw material gas reaches the entire wafer surface and the molecules of the Zr raw material gas (TEMAZ) are adsorbed to the wafer surface.

For example, a moisture concentration in a gas flowing from the moisture detection part 4 to the exhaust path 24 is detected from a time at which the raw material gas supply step starts (time t0). Since the internal atmosphere of the reaction vessel 1 is exhausted through the exhaust path 24, the moisture concentration in the exhausted gas corresponds to a moisture concentration within the reaction vessel 1. Thus, a change in the moisture concentration detected by the moisture detection part 4 may be recognized as a change in the moisture concentration within the reaction vessel 1. In the raw material gas supply step, the moisture concentration in the exhausted gas is rarely changed, and thus, it may be considered that the moisture concentration within the reaction vessel 1 is rarely changed.

Subsequently, at time t1, the valve V1 is closed, the supply of the Zr raw material gas is stopped, and a gas exhaust step of vacuum-exhausting the interior of the reaction vessel 1 is executed. Accordingly, the Zr raw material gas remaining in the reaction vessel 1 is discharged and the internal moisture of the reaction vessel 1 is also discharged, and thus, the moisture concentration within the reaction vessel 1 is gradually lowered. Thereafter, at time t2, the valve V3 is opened to supply an $N_2$ gas as a substitution gas into the reaction vessel 1 to perform $N_2$ purging to thereby substitute the internal atmosphere of the reaction vessel 1 with the $N_2$ gas. When the $N_2$ purging is performed, since the interior of the reaction vessel 1 is vacuum-exhausted while supplying the $N_2$ gas thereto, the internal moisture of the reaction vessel 1 is discharged along with a flow of the $N_2$ gas, so that the moisture concentration within the reaction vessel 1 is further lowered.

Subsequently, at time t3, the valve V3 is closed and the supply of the $N_2$ gas is stopped, and at the same time the valve V2 is opened and a step of supplying an $O_3$ gas as an oxidation gas into the reaction vessel 1 is executed. Accordingly, the molecules of the Zr raw material gas are oxidized on the surface of the wafer W by $O_3$ to form a thin film of a zirconium oxide film ($ZrO_2$ film). Further, a moisture concentration of a gas discharged from the reaction vessel 1 is initially rapidly increased immediately after the $O_3$ gas is supplied, and subsequently gradually decreased.

The reason why the moisture concentration is increased immediately after the $O_3$ gas is supplied is presumed as follows. The Zr raw material gas is an organic material containing Zr, and contains carbon (C) and hydrogen (H). When the Zr raw material gas is supplied into the reaction vessel 1, the Zr raw material gas is adsorbed to the wafer surface and also to an inner wall of the reaction vessel 1. Further, even though the vacuum exhaust or $N_2$ purging is performed, the gas adsorbed to the inner wall of the reaction vessel 1 is not eliminated from the inner wall of the reaction vessel 1 but remains in the adsorbed state. Here, when an $O_3$ gas is supplied, water ($H_2O$) is produced by a reaction of H in the Zr raw material gas and $O_3$. Immediately after the $O_3$ gas is supplied, a large amount of moisture is produced particularly by the reaction with the Zr raw material gas adsorbed to the inner wall of the reaction vessel 1, so that a moisture concentration within the reaction vessel 1 is rapidly increased. Further, as the internal moisture of the reaction vessel 1 is removed through the vacuum exhaust of the interior of the reaction vessel 1, the moisture concentration is gradually lowered.

Referring back to the film forming process, at time t4, the valve V2 is closed and the supply of the $O_3$ gas is stopped to complete the $O_3$ gas supply step, and in the state where the supply of gas is stopped, a gas exhaust step of vacuum-exhausting the interior of the reaction vessel 1 starts. Subsequently, at time t5, the valve V3 is opened to supply an $N_2$ gas for substitution into the reaction vessel 1 to perform an $N_2$ purge step. In this manner, the interior of the reaction vessel 1 is substituted with the $N_2$ gas, and at time t6, the valve V3 is closed to complete the $N_2$ purge step. In addition, in this example, the atmosphere substitution step is executed by the gas exhaust step and the $N_2$ purge step.

By repeating this series of processes by a preset number of times, the thin film of the $ZrO_2$ film is stacked on the surface of the wafer W one by one so that the $ZrO_2$ film having a desired thickness is formed on the surface of the wafer W. After the film forming process is performed in this manner, for example, the valve V3 is opened and the $N_2$ gas is supplied to the reaction vessel 1 to return the interior of the reaction vessel 1 to atmospheric pressure. Subsequently, the wafer boat 3 is unloaded, the wafer W, of which the film forming process has been completed, is extracted from the wafer boat 3, and then a wafer W, which has not been processed, is received in the wafer boat 3.

However, since the $O_3$ gas remaining in the reaction vessel 1 is discharged by the execution of the gas exhaust step and the internal moisture of the reaction vessel 1 is also discharged by the discharge of the $O_3$ gas, a moisture concentration within the reaction vessel 1 is gradually lowered. Also, as already described above, when the $N_2$ purging is performed, the interior of the reaction vessel 1 is vacuum-exhausted while supplying an $N_2$ gas thereto, and thus, the internal moisture of the reaction vessel 1 is discharged together with the $N_2$ gas, which results in further lowering the moisture concentration within the reaction vessel 1.

The moisture concentration within the reaction vessel 1 is gradually lowered as the vacuum exhaust or $N_2$ purging is in progress. However, even though the vacuum exhaust or $N_2$ purging has been performed, a moisture concentration after the $O_3$ gas supply step is higher than that before the $O_3$ gas supply step. It is presumed that the reason is because, even though the internal moisture of the reaction vessel 1 may be mostly removed by the vacuum exhaust or $N_2$ purging for a predetermined period of time, a portion of moisture remains and is attached to the inner wall of the reaction vessel 1. Actually, when $H_2O$ is experimentally supplied into the reaction vessel 1 during the supply of the $O_3$ gas, the moisture concentration rarely decreases, and thus it is apparent that the $H_2O$ has a property of being difficult to exhaust, compared with $O_3$ or $O_2$.

Thus, since the moisture concentration within the reaction vessel 1 is gradually increased whenever the $O_3$ gas is supplied, it is considered that the moisture concentration within the reaction vessel 1 will be increased as the number of times of film formation is increased, and thus, it is presumed that an accidental degradation of film quality according to the continuation of film forming process attributes to the increase in the moisture concentration within the reaction vessel 1. It is considered that the reason is because, when the moisture concentration within the reaction vessel 1 is high, a portion of the $ZiO_2$ film obtained by the reaction of the Zr raw material gas and the $O_3$ gas is formed by chemical vapor deposition (CVD), rather than ALD, which results in introducing C, H, and N into the film as impurities, thereby degrading film density.

Figure 4:
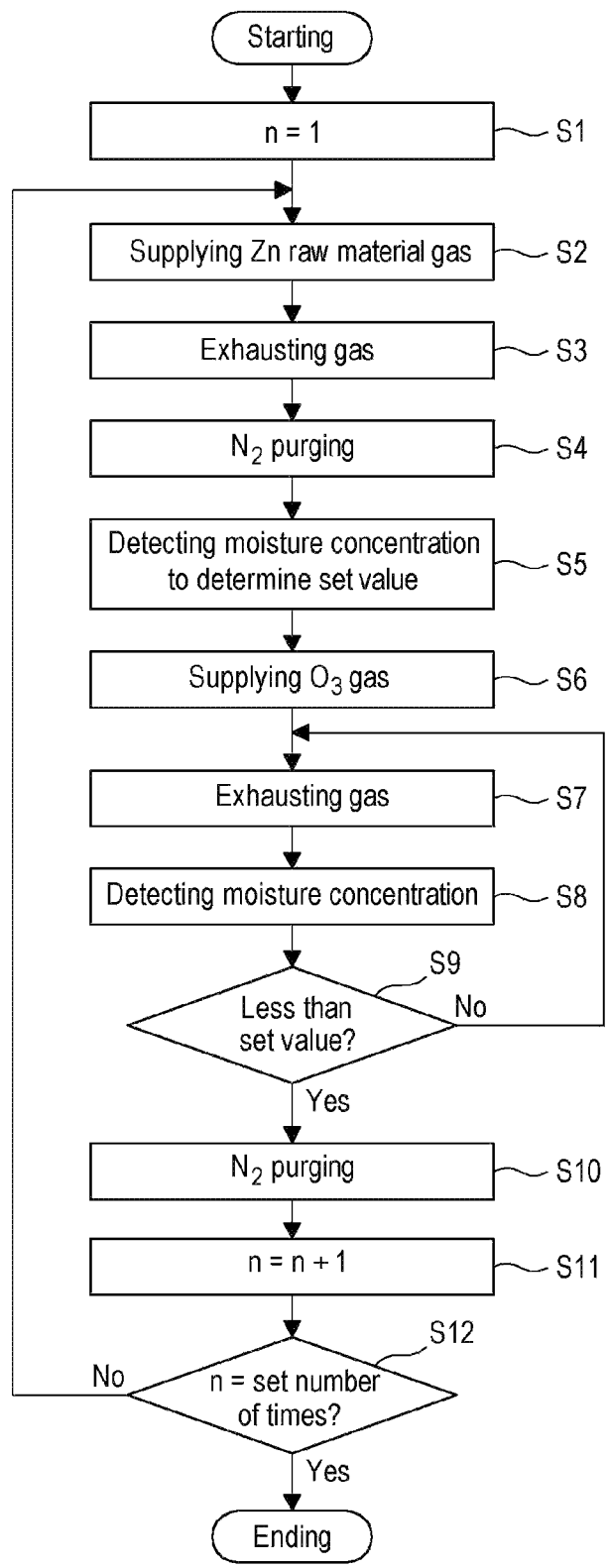
FIG. 4 is a flowchart illustrating a first method of a film forming method of the present disclosure.
Figure 5:
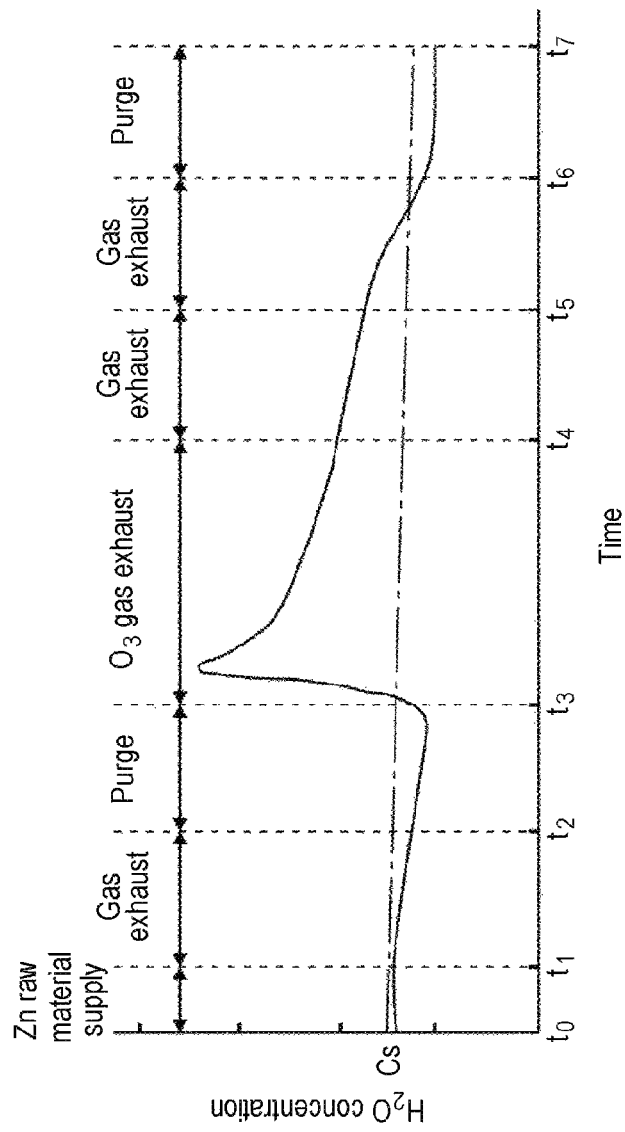
FIG. 5 is a characteristic diagram illustrating a change in moisture concentration over time in a film forming process of the first method.

Next, a control method of the present disclosure will be described. This control method is to lower a moisture concentration within the reaction vessel 1, and a representative example thereof will be described below with reference to a flowchart. First, a first method will be described with reference to FIGS. 4 and 5. FIG. 4 is a flowchart of the first method, and FIG. 5 is a characteristic diagram schematically illustrating a change in a moisture concentration in a gas flowing in the exhaust path 24 detected by the moisture detection part 4 over time. Also, a part of the description that overlaps with the general film forming process described above will be omitted.

As illustrated in FIG. 4, first, n is set to 1 as an initial position (step S1), and the valve V1 is opened and a first-time step of supplying a Zr raw material gas starts (step S2). Subsequently, at time t1, the valve V1 is closed and a gas exhaust step of vacuum-exhausting the interior of the reaction vessel 1 is executed (step S3) to discharge the Zr raw material gas remaining in the reaction vessel 1. Thereafter, at time t2, the valve V3 is opened to supply an N2 gas into the reaction vessel 1 to perform N2 purging (step S4).

A moisture concentration in a gas flowing in the exhaust path 24 is detected from, for example, time t0 at which the supply of the Zr raw material gas starts, by the moisture detection part 4. And then, after step S2 of supplying a raw material gas first time is completed, a set value Cs is determined based on a detected value of the moisture concentration detected by the moisture detection part 4 (step S5). The expression "after the completion of the first-time step of supplying a raw material gas" means a timing at which the first supply of the raw material gas is stopped (time t1 illustrated in FIG. 5). However, it may be a timing before the $N_2$ purge step is completed since the first-time supply of the raw material gas has been stopped, namely, between times t1 to t3 illustrated in FIG. 5.

Further, the set value may be a moisture concentration itself after the completion of the first-time step of supplying the raw material gas (referred to as a first-time moisture concentration for the convenience of description), or may be a value obtained by adding a preset value to the corresponding moisture concentration. The first-time moisture concentration reflects a moisture concentration in the raw material gas, which is originally not lowered compared with the corresponding moisture concentration in the system, and thus, the first-time moisture concentration is appropriately employed as the set value. However, a moisture concentration may affect film quality, but in some cases, film quality may not be degraded even though the set value is higher than the first-time moisture concentration according to the types of films. Further, after the first-time step of supplying a raw material gas, the moisture concentration is gradually lowered as the interior of the reaction vessel 1 is vacuum-exhausted (gas exhausted) and undergoes $N_2$ purging. Thus, even though the set value is slightly higher than the first-time moisture concentration, an influence thereof on film quality can be suppressed. Therefore, it is possible to set a value obtained by adding a preset value to the first-time moisture concentration as the set value Cs, in the aspect of avoiding prolonging of the atmosphere substitution step. The set value Cs illustrated in FIG. 5 is determined by adding a preset value to the first moisture concentration. The preset value is a value obtained through, for example, an experiment or the like in advance.

Subsequently, at time t3, the valve V3 is closed and the valve V2 is opened to execute a step of supplying an $O_3$ gas into the reaction vessel 1 (step S6). Thereafter, at time t4, the valve V2 is closed and the supply of the $O_3$ gas is stopped, and in this state, a gas exhaust step of vacuum-exhausting the interior of the reaction vessel 1 is executed (step S7). After the gas exhaust step is completed, the moisture detection part 4 detects a moisture concentration in the gas flowing in the exhaust path 24 (step S8) and compares the detected value with the set value (step S9).

And then, when the detected value is smaller than the set value, the process proceeds to step S10 to execute an $N_2$ purge step. That is, for example, at time t5, the valve V3 is opened and an $N_2$ gas is supplied into the reaction vessel 1 to start purging. For example, at time t6, the valve V3 is closed and the purging is completed. Thereafter, in step S11, the processing number of times is added by one time (n=n+1), and in step S12, it is determined whether n is a preset number of times. When n is smaller than the preset number of times, the process returns to step S2 to continue the film forming process. When n is equal to the preset number of times, the process is completed. In this manner, the series of processes are repeated by a preset number of times to form a $ZiO_2$ film having a desired thickness on the surface of the wafer W.

Meanwhile, in step S9, when the detected value of moisture concentration exceeds the preset value, the control part 100 outputs a control signal for prolonging the gas exhaust step, as a control signal for increasing the substitution operation of the atmosphere substitution step. Referring to the flowchart, the process returns to step S7 by the control signal to perform the gas exhaust step again. Specifically, as illustrated in FIG. 5, at time t5, the valve V2 is left open and the interior of the reaction vessel 1 continues to be vacuum-exhausted. And then, when the gas exhaust step is completed (at time t6), the moisture detection part 4 detects a moisture concentration in the gas flowing in the exhaust path 24 again (step S8) and compares the detected value with the set value (step S9).

Thereafter, when the detected value is smaller than the set value, the process proceeds to step S10 to execute an $N_2$ purge step. That is, at time t6, the valve V3 is opened and the $N_2$ gas is supplied into the reaction vessel 1 to start purging, and at time t7, the valve V3 is closed and the purging is completed. Subsequently, the process proceeds to steps S11 and S12. Meanwhile, when the detected value exceeds the set value in step S9, the process returns to step S7 to execute the gas exhaust step again.

According to this method, a moisture concentration within the reaction vessel 1 is recognized by detecting a moisture concentration in the gas exhausted from the reaction vessel 1, and when the moisture concentration in the gas exceeds the set value, it is controlled such that the gas exhaust step is again executed to lengthen the vacuum exhaust time. According to the characteristic diagram of FIG. 3, since the moisture concentration is gradually lowered as the vacuum exhaust is in progress, it is understood that the lengthening of the vacuum exhaust time can increase the substitution operation of the atmosphere substitution step to further lower the moisture concentration within the reaction vessel 1. FIG. 5 illustrates a case in which a moisture concentration is reduced to be lower than the preset value by adding the gas exhaust step one time. By performing the gas exhaust step twice in this manner, the moisture concentration can be reduced to be lower than the preset value when performing the $N_2$ purge step thereafter.

Further, since the moisture detection part 4 is installed to detect a moisture concentration in a gas flowing in the exhaust path 24, it may detect a moisture concentration in a gas in real time when the film forming process is performed. Thus, it is possible to rapidly control the substitution operation based on the detected value, so that the moisture concentration can be controlled with high precision. Also, in this method, the moisture concentration that will be compared with the set value is detected at the time of completing the gas exhaust step. The detection timing includes, for example, not only the completion time of the gas exhaust step S7 but also a time immediately before the completion time.

In the foregoing embodiment, the atmosphere substitution step including the step of supplying the Zr raw material gas into the reaction vessel 1, the step of substituting the interior of the reaction vessel 1 with the $N_2$ gas and subsequently supplying the $O_3$ gas into the reaction vessel 1, and the step of supplying the $N_2$ gas into the reaction vessel 1 are repeatedly executed. Further, a moisture concentration in the gas flowing in the exhaust path 24 is detected by the moisture detection part 4 after the step of supplying the $O_3$ gas starts and before the step of supplying the Zr raw material gas starts, and when the detected value exceeds the set value, the substitution operation of the atmosphere substitution step is increased. Since moisture is removed from the interior of the reaction vessel 1 according to the atmosphere substitution of the reaction vessel 1, the moisture removal effect is increased by increasing the substitution operation.

Thus, a moisture concentration in the gas flowing in the exhaust path 24 can be controlled to be lower than the set value by adjusting a degree of the substitution operation based on the detected moisture concentration in the gas. This means that a moisture concentration within the reaction vessel 1 is constantly low, and a step of supplying a raw material gas at a next time is executed in a state where a moisture concentration is constantly low within the reaction vessel 1. As a result, film formation by a CVD method is suppressed and a $ZrO_2$ film is formed through an ALD method within the reaction vessel 1. Thus, it is possible to suppress an increase in impurities in the film caused by the internal moisture within the reaction vessel 1 or degradation of film density or coverage performance, so that a thin film formed of a metal oxide having desirable film quality can be formed and a desirable film forming process can be performed stably.

Second Method

Next, a second method of the present disclosure will be described. The second method is different from the first method, in that a moisture concentration detected at a completion time of the $N_2$ purge step is compared with the set value, and when the moisture concentration exceeds the set value, a control signal for prolonging the $N_2$ purge step is output to increase a substitution operation.

Figure 6:
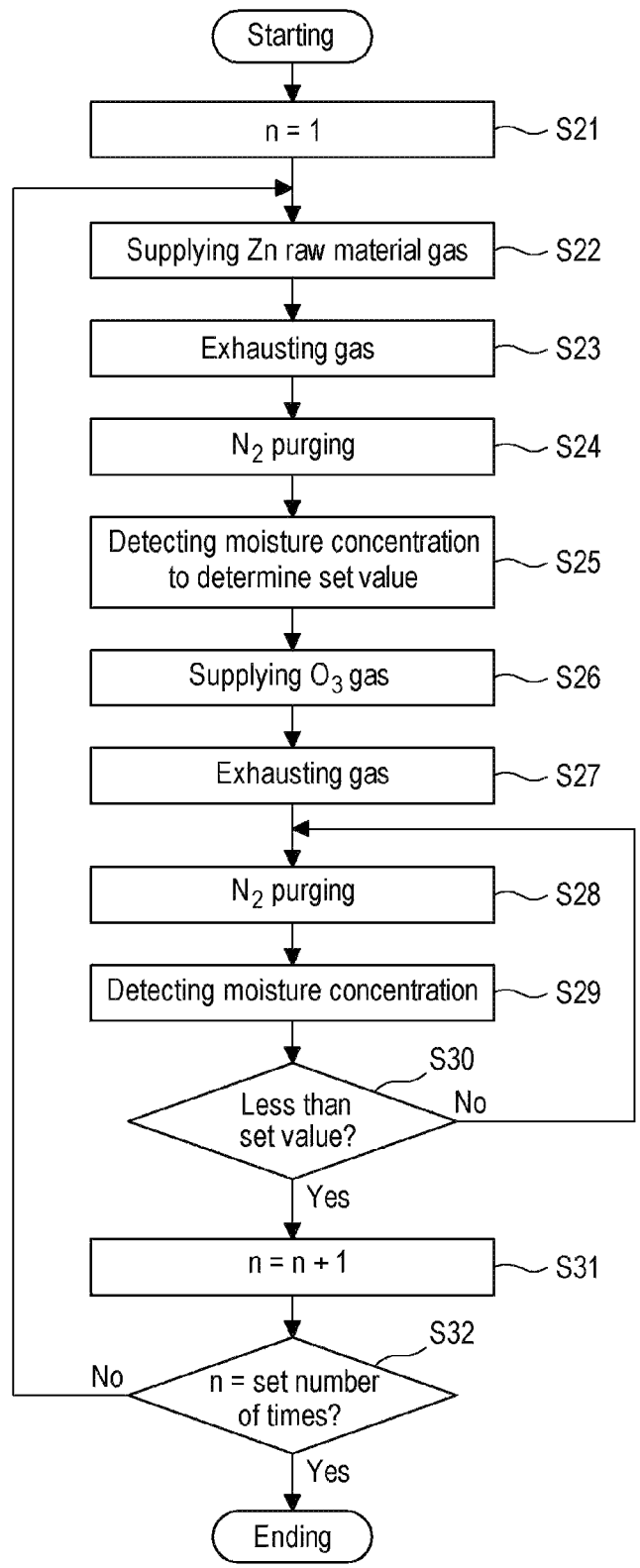
FIG. 6 is a flowchart illustrating a second method of a film forming method of the present disclosure.

Particularly, this method will be described in detail with reference to FIGS. 6 and 7. Steps S21 to S27 in the flowchart of FIG. 6 are the same as steps S1 to S7 in the flowchart of FIG. 4 of the first method, and therefore, a description thereof will be omitted. In this method, after the gas exhaust step S27 is performed, the $N_2$ purge step S28 is performed. That is, as illustrated in FIG. 7, at time t5, the valve V3 is opened and the $N_2$ gas is supplied into the reaction vessel 1 to start purging.

Figure 7:
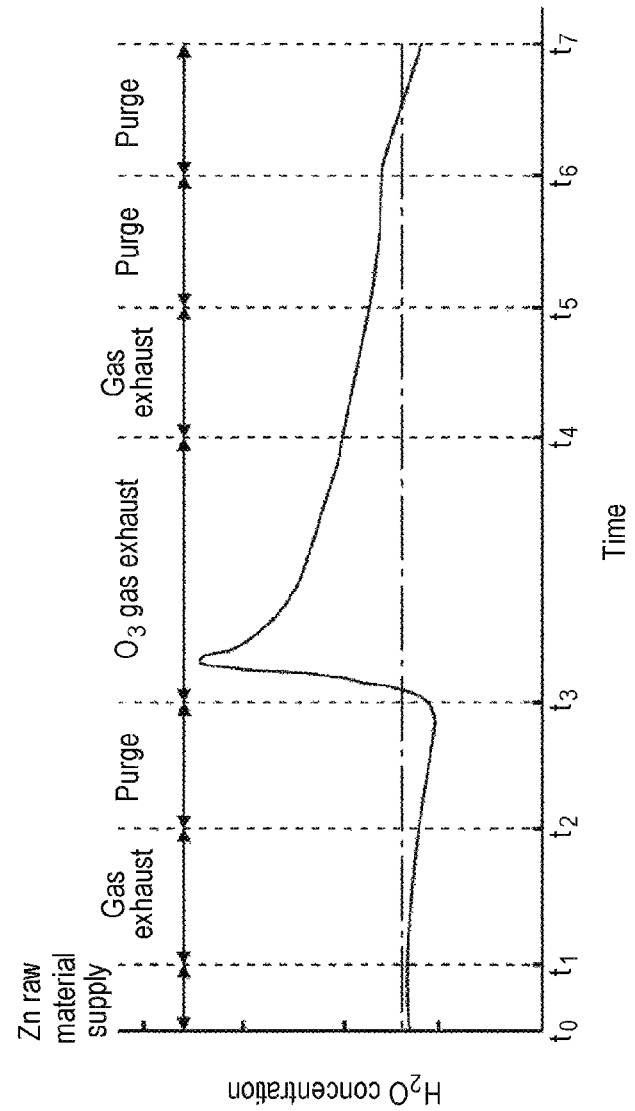
FIG. 7 is a characteristic diagram illustrating a change in moisture concentration over time in the film forming process of the second method.

And then, at time t6 in FIG. 7, the valve V3 is closed and the purging is completed. For example, at time t6, a moisture concentration in a gas flowing in the exhaust path 24 is detected by the moisture detection part 4 (step S29) and the detected value is compared with the set value (step S30). When the detected value is smaller than the set value, the process proceeds to step S31 to add one time to a processing number of times (n=n+1), and it is checked whether n is a preset number of times in step S32. When n is less than the preset number of times, the process returns to step S22 to continue the film forming process, and when n is equal to the preset number of times, the process is completed. In this manner, a series of processes is repeated a preset number of times to form a $ZrO_2$ film having a desired thickness on the surface of the wafer W.

Meanwhile, when the detected value exceeds the set value, the control part 100 outputs a control signal for prolonging the $N_2$ purge step, as a control signal for increasing the substitution operation of the atmosphere substitution step, and accordingly, the process returns to step S28 to repeat the $N_2$ purge step (see FIG. 7). And, when the $N_2$ purge step is completed (at time t7), a moisture concentration is detected by the moisture detection part 4 (step S29), and the detected value is compared with the set value (step S30). And then, when the detected value is lower than the preset value, the process proceeds to steps S31 and S32. Meanwhile, in step S30, when the detected value exceeds the set value, the process returns back to step S28 to execute the $N_2$ purge step again.

According to this method, a moisture concentration within the reaction vessel 1 is recognized by detecting a moisture concentration in the gas exhausted from the reaction vessel 1, and when the moisture concentration in the gas exceeds the set value, it is controlled such that a supply time of the $N_2$ gas of the $N_2$ purge step is lengthened. According to the characteristic diagram of FIG. 3, since the moisture concentration is gradually lowered as the $N_2$ purge is in progress, it is understood that the lengthening of the purge time can increase the substitution operation of the atmosphere substitution step to further lower the moisture concentration within the reaction vessel 1. FIG. 7 illustrates a case in which a moisture concentration is reduced to be lower than the set value by adding the $N_2$ purge step one time. In this manner, by lengthening the purge time, the substitution operation of the reaction vessel 1 can be increased to reduce the moisture concentration to be lower than the set value. In this method, the moisture concentration that will be compared with the set value is detected at the time of completing the $N_2$ purge step. The detection timing includes, for example, not only a completion time of the $N_2$ purge step but also a time immediately before the completion time.

As mentioned above, the moisture concentration detected at a completion time of the $N_2$ purge step after the supply of the $O_3$ gas is compared with the set value, and when the moisture concentration exceeds the set value, a control signal for performing at least one of prolonging the $N_2$ purge step and additional execution of the gas exhaust step may be output to increase the substitution operation.

Specifically, when the initial $N_2$ purge step is completed after the supply of the $O_3$ gas, a moisture concentration is detected by the moisture detection part 4 and the detected value is compared with the set value. When the detected value is lower than the set value, the $N_2$ purge step is completed. And then, when the processing number of times is less than the preset number of times, a $(n+1)^{th}$ film forming process continues, and when the processing number of times is equal to the preset number of times, the process is completed. Meanwhile, when the detected value exceeds the set value, the control part 100 outputs a control signal for performing at least one of prolonging the $N_2$ purge step and performing the gas exhaust step, as a control signal for increasing the substitution operation of the atmosphere substitution step.

When the control signal for prolonging the $N_2$ purge step is output, for example, after the first $N_2$ purge step is completed, a second $N_2$ purge step is executed. And then, when the second $N_2$ purge step is completed, a moisture concentration is detected by the moisture detection part 4, and the detected value is compared with the set value. When the detected value is lower than the set value, the $N_2$ purge step is completed, and when the processing number of times is less than the preset number of times, the $(n+1)^{th}$ film forming process continues, and when the processing number of times is equal to the preset number of times, the process is completed. When the detected value exceeds the set value, the control part 100 outputs a control signal for prolonging the $N_2$ purge step, as a control signal for increasing the substitution operation of the atmosphere substitution step, and executes a third $N_2$ purge step.

Further, when a control signal for further performing the gas exhaust step is output, for example, after the first $N_2$ purge step is completed next to the supply of the $O_3$ gas, the gas exhaust step (a second gas exhaust step) is executed again. Also, for example, when the second gas exhaust step is completed, a moisture concentration is detected by the moisture detection part 4, and the detected value is compared with the set value. When the detected value is lower than the set value, the gas exhaust step is completed, and when the processing number of times is less than the preset number of times, the $(n+1)^{th}$ film forming process continues, and when the processing number of times is equal to the preset number of times, the process is completed. When the detected value exceeds the set value, the control part 100 outputs a control signal for further performing the gas exhaust step, as a control signal for increasing the substitution operation of the atmosphere substitution step, and executes a third gas exhaust step.

In addition, when the control signal for prolonging of the $N_2$ purge step and further performing the gas exhaust step is output, for example, after the first $N_2$ purge step is completed next to the supply of the $O_3$ gas, the gas exhaust step (a second gas exhaust step) is again executed, and a second $N_2$ purge step is subsequently executed. Further, for example, when the second $N_2$ purge step is completed, a moisture concentration is detected by the moisture detection part 4 and the detected value is compared with the set value. Also, after the first $N_2$ purge step is completed, the second $N_2$ purge step may be executed and the second gas exhaust step may be executed, and when the second gas exhaust step is completed, a moisture concentration may be detected by the moisture detection part 4 and the detected value may be compared with the set value.

In this method, when the $N_2$ purge step is completed, a moisture concentration in the gas flowing in the exhaust path 24 is detected, and when the detected value exceeds the set value, the control signal for performing at least one of prolonging the $N_2$ purge step and performing the gas exhaust step is output. As already described above, since the prolonging of the $N_2$ purge step and the execution of the gas exhaust step are effective for removing the internal moisture of the reaction vessel 1, it is possible to further reliably reduce the detected value of moisture concentration to be lower than the set value to stably perform a more desirable film forming process.

Third Method

Next, a third method of the present disclosure will be described. This method is different from the first method, in that the moisture concentration detected during performing the step of supplying the $O_3$ gas into the reaction vessel 1 or at a time of completing the corresponding step compared with the set value. Also, when the moisture concentration exceeds the preset value, a control signal for increasing a set value of an exhaust speed at the time of the gas exhaust step is output to increase a substitution operation.

Figure 8:
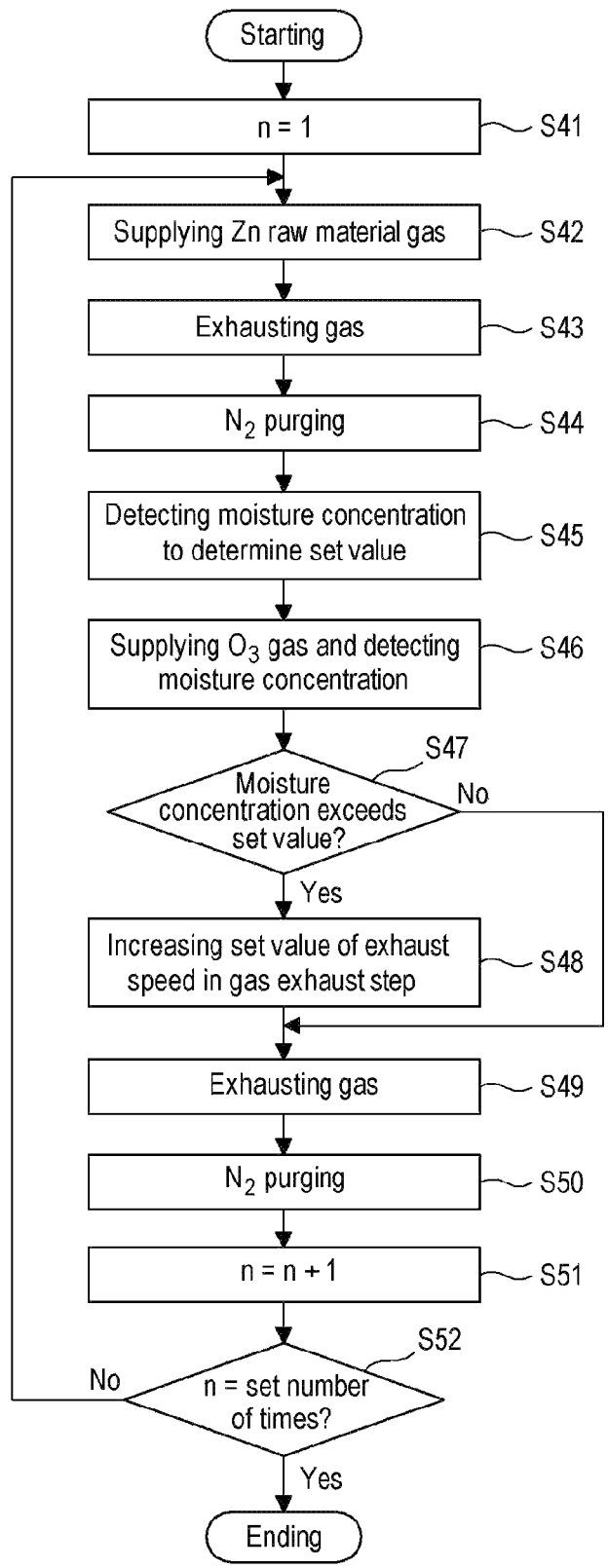
FIG. 8 is a flowchart illustrating a third method of a film forming method of the present disclosure.

Particularly, this method will be described in detail with reference to FIG. 8. Steps S41 to S45 in the flowchart of FIG. 8 are the same as steps S1 to S5 in the flowchart of FIG. 4, and therefore, a description thereof will be omitted. In this embodiment, like the first method, step S42 of supplying a Zr raw material gas into the reaction vessel 1, a gas exhaust step S43 of vacuum-exhausting the interior of the reaction vessel 1, and step S44 of $N_2$-purging the interior of the reaction vessel 1 are sequentially performed. Thereafter, the valve V3 is closed and an $N_2$ purge step S44 is completed. And then, the valve V2 is opened and a step of supplying an $O_3$ gas into the reaction vessel 1 is executed (step S46). Also, for example, when the step of supplying the $O_3$ gas is completed, the moisture detection part 4 detects a moisture concentration of the exhausted gas.

Thereafter, the detected value is compared with a set value in step S47. As already described above, due to the supply of the $O_3$ gas, the moisture concentration within the reaction vessel 1 is rapidly increased and then gradually lowered, but a moisture concentration when the $O_3$ gas supply step is completed is slightly high, compared with that when the gas exhaust step or the $N_2$ purge step is completed. Thus, the set value determined in step S45 is a value obtained by adding a set amount to the moisture concentration after the step of supplying a raw material gas for the first time is completed. The set amount is a value obtained through an experiment in advance.

When the detected value is lower than the set value, the process proceeds to step S49 to close the valve V2 to perform a gas exhaust step of vacuum-exhausting the interior of the reaction vessel 1 in step S49, and then executes a step of opening the valve V3 and $N_2$-purging the interior of the reaction vessel 1 (step S50). Subsequently, the processing number of times in step S51 is added by one time (n=n+1), and it is checked whether n is a preset number of times in step S52. And, when n is less than the preset number of times, the process returns to step S42 to continuously perform the film forming process, and when n is equal to the preset number of times, the process is completed.

Meanwhile, when the detected value exceeds the set value, the control part 100 outputs a signal for increasing the set value of an exhaust speed of the gas exhaust step, as a control signal for increasing a substitution operation of the atmosphere substitution step (step S48). Thus, the exhaust speed is adjusted by, for example, the flow rate adjusting part 25. And then, in step S49, a gas exhaust step of vacuum-exhausting the interior of the reaction vessel 1 is executed at the increased exhaust speed. The following steps S50 to S52 are the same as described above.

In this embodiment, a moisture concentration in a gas flowing in the exhaust path 24 when the step of supplying the $O_3$ gas is completed is detected, and when the detected value exceeds the set value, a control signal for increasing the exhaust speed of the gas exhaust step is output. Thus, since the internal atmosphere of the reaction vessel 1 is exhausted at a high exhaust speed, the internal moisture of the reaction vessel 1 is rapidly removed. Accordingly, even though a moisture concentration at a timing after the supply of the $O_3$ gas supply is higher than the set value, the internal moisture of the reaction vessel 1 can be reliably removed without lengthening a time for the gas exhaust step. Thus, it is possible to suppress a degradation of throughput to thereby form a $ZrO_2$ film having desirable film quality and coverage characteristics and also to stably perform a desirable film forming process.

Further, in this method, when the detected value exceeds the set value, the control part 100 may output a control signal for increasing a flow rate of the $N_2$ gas in the $N_2$ purge step, instead of a signal for increasing the set value of the exhaust speed at the gas exhaust step, as a control signal for increasing the substitution operation of the atmosphere substitution step. For example, the $N_2$ purge step is performed by opening the valves V3 and V4 and supplying the $N_2$ gas into the reaction vessel 1 through the substitution gas supply path 71 and the raw material gas supply path 51, so that the flow rate of the $N_2$ gas is adjusted by, for example, the flow rate adjusting parts 72 and 80. In this case, the gas exhaust step is performed at a general exhaust speed and the flow rate of the $N_2$ gas is subsequently increased to execute the $N_2$ purge step within the reaction vessel 1.

In this example, since the flow rate of the $N_2$ gas within the reaction vessel 1 is increased during the performance of the $N_2$ purge step, a flow velocity of the $N_2$ gas within the reaction vessel 1 is increased, and the internal moisture of the reaction vessel 1 is rapidly removed by the force of the $N_2$ gas flow. Accordingly, even though a moisture concentration at a timing after the supply of the $O_3$ gas is higher than the set value, the internal moisture of the reaction vessel 1 can be reliably removed without lengthening a time for the $N_2$ purge step. Thus, it is possible to suppress a degradation of throughput to thereby form a $ZrO_2$ film having desirable film quality and coverage characteristics and also to stably perform a desirable film forming process.

Further, in this example, when the detected value exceeds the set value, the control part 100 may output a control signal to increase the exhaust velocity of the gas exhaust step and increase a flow rate of the $N_2$ gas in the $N_2$ purge step, as a control signal for increasing a substitution operation of the atmosphere substitution step. Thus, the exhaust speed is adjusted by, for example, the flow rate adjusting part 25, and the flow rate of the $N_2$ gas is adjusted by, for example, the flow rate adjusting part 72. In this example, since the gas exhaust step is executed by increasing the exhaust speed and the $N_2$ purge step is executed by increasing a flow rate of the $N_2$ gas, the internal moisture of the reaction vessel 1 is further rapidly removed. Accordingly, even though a moisture concentration at a timing after the supply of the $O_3$ gas is higher than the set value, it is possible to reliably remove the internal moisture of the reaction vessel 1 and suppress a degradation of throughput to stably perform a desirable film forming process.

Further, in the third method, a moisture concentration at a time of performing the step of supplying the $O_3$ gas into the reaction vessel 1 may be compared with the set value. The moisture concentration may be obtained from a time at which the O3 gas supply step starts to a time at which a predetermined period of time lapses, or may be a value when the moisture concentration reaches a peak. Also, it may be an average value or an integration value of detected values obtained from a time at which the $O_3$ supply step starts to a time at which the $O_3$ supply step is completed. Thus, the set value of the moisture concentration is set according to cases, and may be set based on a moisture concentration when the step of supplying a raw material gas for the first time is completed, or a preset value may be used.

Also, in the third method, when the detected moisture concentration exceeds the set value, the gas exhaust step is performed by increasing the set value of the exhaust speed, and when the gas exhaust step is completed, a moisture concentration is detected and compared with the set value. Further, when the detected moisture concentration exceeds the set value, at least one of prolonging of the gas exhaust step and prolonging of the $N_2$ purge step may be performed to accelerate the substitution operation.

Similarly, when the detected moisture concentration exceeds the set value, the $N_2$ purge step is performed by increasing the flow rate of the $N_2$ gas, and when the $N_2$ purge step is completed, a moisture concentration is detected and compared with the set value. Also, when the detected moisture concentration exceeds the set value, at least one of prolonging the gas exhaust step and prolonging of the $N_2$ purge step may be performed to accelerate the substitution operation.

The first to third methods described above are representative examples of the control method of the present disclosure and the present disclosure is not limited thereto. For example, in the first method, in order to prolong the gas exhaust step of performing vacuum exhaust in a state where a gas supply is stopped, the example of repeating the same step is shown as an example of the prolonging in this method, but the step at the general time may be repeated or a step shorter or longer than the step at the general time may also be performed. That is, a predetermined time may be lengthened, without being limited to the case of repeating for the same period of time. Alternatively, in the first method and the second method, the gas exhaust step may be performed at the general time and at a higher exhaust speed than that at the general time to increase the substitution operation. Further, in the first to third methods, the vacuum exhaust in a state where the gas supply is stopped also includes a case in which a small amount of gas is supplied because the case is not much different from the case in which the gas supply is substantially stopped.

Moreover, for example, in order to prolong the step of supplying the gas for substitution into the reaction vessel in the second method, the example of repeating the same step is as an example of prolonging the step of supplying in this method, but the step using a normal time period may be repeated or a step shorter or longer than the step using a normal time period may also be performed. That is, the predetermined time may be lengthened, without being limited to the case of repeating for the same period of time. Alternatively, in the second method, the step of supplying a gas for substitution into the reaction vessel may be performed using a normal time period and at a higher flow rate of the gas for substitution rather than using a normal time period.

In addition, the set value to be compared with the moisture concentration detected by the moisture detection part may be a value obtained through an experiment in advance. Also, the moisture concentration to be compared with the set value may be detected after the step of supplying a gas for oxidation starts and before the step of supplying a raw material gas starts, and for example, a moisture concentration detected after the lapse of a predetermined period of time since the gas exhaust step started may be compared with the set value. Also, a moisture concentration detected after the lapse of a predetermined period of time since the step of supplying a gas for substitution into the reaction vessel started may be compared with the set value.

Further, in the first method, a moisture concentration detected after the lapse of a predetermined period of time since the gas exhaust step started (also including when the gas exhaust step is completed) may be compared with the set value, and when the detected value exceeds the set value, the step of supplying a gas for substitution into the reaction vessel may be prolonged or the flow rate of the gas for substitution may be increased to increase the substitution operation. Also, in the first method, by prolonging the gas exhaust step, a moisture concentration when the gas exhaust step is completed may be detected and compared with the set value. Also, when the detected value exceeds the set value, the $N_2$ purge step may be prolonged. Also, when the gas exhaust step is prolonged, the $N_2$ purge step is continuously executed, and then a moisture concentration when the $N_2$ purge step is completed is detected and compared with the set value. Also, when the detected value exceeds the set value, either the gas exhaust step may be further repeated or the $N_2$ purge step may be performed. Also, in the first to third methods, for example, the $N_2$ purge step may be performed by opening the valves V3 and V4 to supply an $N_2$ gas into the reaction vessel 1 through the substitution gas supply path 71 and the raw material gas supply path 51.

In the above, the film forming apparatus of the present disclosure may form an oxide thin film of a metal such as an $SiO_2$ film, a $TiO_2$ film, a $Ta_2O_5$ film, an RuO film, and an $Al_2O_3$ film, in addition to the $ZrO_2$ film. Also, as an organic material containing Zr for forming the $ZrO_2$ film, for example, cyclopentadienyl tris(dimethylamino)zirconium, methylcyclopentadienyl tris(dimethylamino) zirconium, or the like may be used. Also, as an oxidation gas for oxidizing the organic material, an oxygen ($O_2$) gas, a hydrogen peroxide ($H_2O_2$) gas, an $H_2O$ gas, or the like may be used. When the $H_2O$ gas is used as the oxidation gas, $H_2O$ that is not used in oxidation is not decomposed but exhausted through the exhaust path, and here, if $H_2O$ remains to be attached to the inner wall of the reaction vessel, film quality may be degraded. Thus, a moisture concentration in a gas flowing in the exhaust path is detected, and when the detected value exceeds the set value, the moisture concentration within the reaction vessel 1 needs to be lowered by increasing the substitution operation within the reaction vessel, and thus, it is effective to apply the present disclosure thereto.

Further, the present disclosure is not limited to the apparatus for performing a film forming process on the wafers loaded on the wafer boat in multiple stages within the reaction vessel of the vertical heat treatment apparatus and may also be applied to an apparatus for stacking a reaction product through a so-called ALD method.

According to some embodiments of the present disclosure, an atmosphere substitution step including a step of supplying a raw material gas into a reaction vessel under a vacuum atmosphere, a step of substituting an internal atmosphere of the reaction vessel with a substitution gas and subsequently supplying an oxidation gas into the reaction vessel, and a step of supplying a gas for substitution into the reaction vessel is executed. Further, a moisture concentration in a gas flowing in the exhaust path of the reaction vessel after the initiation of the step of supplying the gas for substitution and before the step of supplying the raw material gas starts is detected and compared with a set value. When the detected value of the moisture concentration exceeds the set value, a substitution operation of the atmosphere substitution step is increased. Thus, the next-time step of supplying a raw material gas is performed in a state where the moisture concentration in the gas flowing in the exhaust path is lower than the set value, that is, in a state where the moisture concentration within the reaction vessel is low. As a result, it is possible to suppress an increase in impurities within the film caused by the internal moisture of the reaction vessel or a degradation of coverage performance, stably performing a desirable film forming process.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus which forms a thin film formed of a metal oxide on a substrate by alternately supplying a raw material gas formed of an organic material containing a metal and an oxidation gas for oxidizing the organic material to the substrate a plurality of times, within a reaction vessel under a vacuum atmosphere, the film forming apparatus comprising:
    a vacuum-exhaust mechanism configured to exhaust an interior of the reaction vessel through an exhaust path;
    a moisture detection part configured to detect a moisture concentration in a gas flowing in the exhaust path;
    a substitution gas supply part configured to supply a substitution gas for substituting an internal atmosphere of the reaction vessel into the reaction vessel; and
    a control part configured to output a control signal for executing a step of supplying the raw material gas into the reaction vessel, a step of substituting the internal atmosphere of the reaction vessel with the substitution gas and then supplying the oxidation gas into the reaction vessel subsequent to the step of supplying the raw material gas, and an atmosphere substitution step including a step of supplying the substitution gas into the reaction vessel consecutively, and further output a control signal for comparing the moisture concentration detected by the moisture detection part with a set value after initiation of the step of supplying the oxidation gas and before starting the step of supplying the raw material gas, and when the moisture concentration exceeds the set value, for increasing a substitution operation of the atmosphere substitution step.

2. The apparatus of claim 1, wherein the set value is a value set based on a moisture concentration after the step of supplying the raw material gas a first time is completed.

3. The apparatus of claim 1, wherein the atmosphere substitution step comprises a gas exhaust step of performing vacuum exhaust in a state where the supply of a gas is stopped, and a step of supplying the substitution gas into the reaction vessel after the gas exhaust step.

4. The apparatus of claim 3, wherein the moisture concentration to be compared with the set value is a moisture concentration detected when the gas exhaust step is completed, and the control signal for increasing the substitution operation of the atmosphere substitution step is a control signal for prolonging the gas exhaust step.

5. The apparatus of claim 1, wherein the moisture concentration to be compared with the set value is a moisture concentration detected when the step of supplying the substitution gas into the reaction vessel is completed, and
    the control signal for increasing the substitution operation of the atmosphere substitution step is a control signal for prolonging the step of supplying the substitution gas into the reaction vessel.

6. The apparatus of claim 3, wherein the moisture concentration to be compared with the set value is a moisture concentration detected when the step of supplying the substitution gas into the reaction vessel is completed, and
    the control signal for increasing the substitution operation of the atmosphere substitution step is a control signal for performing at least one of prolonging the step of supplying the substitution gas into the reaction vessel and performing the gas exhaust step.

7. The apparatus of claim 1, wherein the moisture concentration to be compared with the set value is a moisture concentration detected when the step of supplying the oxidation gas into the reaction vessel is performed or when the step of supplying the oxidation gas is completed, and
    the control signal for increasing the substitution operation of the atmosphere substitution step is a control signal for increasing a flow rate of the substitution gas in the step of supplying the substitution gas into the reaction vessel.

8. The apparatus of claim 3, wherein the moisture concentration to be compared with the set value is a moisture concentration detected when the step of supplying the oxidation gas into the reaction vessel is performed or when the step of supplying the oxidation gas is completed, and
    the control signal for increasing the substitution operation of the atmosphere substitution step is a control signal for performing at least one of increasing an exhaust speed in the gas exhaust step and increasing a flow rate of the substitution gas in the step of supplying the substitution gas into the reaction vessel.

\* \* \* \* \*